United States Patent [19]

Piccone et al.

[11] Patent Number: 5,005,065
[45] Date of Patent: Apr. 2, 1991

[54] HIGH CURRENT GATE TURN-OFF THYRISTOR

[75] Inventors: Dante E. Piccone, Glenmoore, Pa.; James E. McIntyre, deceased, late of Crum Lynn, Pa., by Anna M. McIntyre, executrix; Leroy B. Major, West Chester, Pa.

[73] Assignee: General Electric Company, King of Prussia, Pa.

[21] Appl. No.: 334,131

[22] Filed: Apr. 6, 1989

[51] Int. Cl.[5] .................... H01L 29/74; H01L 29/747
[52] U.S. Cl. ......................................... 357/38; 357/39
[58] Field of Search .................. 357/38, 38 A, 38 C, 357/38 E, 38 G, 38 L, 38 LA, 38 P, 38 S, 38 T, 39

[56] References Cited

FOREIGN PATENT DOCUMENTS 0099770  6/1984  Japan ............................... 357/38 G
0141774  6/1987  Japan ................................... 357/38

OTHER PUBLICATIONS

*Semiconductor Controlled Rectifiers* by F. E. Gentry et al., published by Prentice-Hall, Inc., Englewood Cliffs, NJ in 1964, pp. 123-129 and 264-267.
*Modern Power Devices* by B. J. Baliga, published by John Wiley and Sons in 1987, New York, NY, pp. 401-403.
*Semiconductor Power Devices* by S. K. Ghandi, published by John Weily and Sons, New York, NY in 1977, pp. 235-243.

Primary Examiner—Rolf Hille
Assistant Examiner—Wael Fahmy
Attorney, Agent, or Firm—Henry J. Policinski; William Freedman

[57] ABSTRACT

This GTO thyristor comprises: (i) a cathode layer that is divided into a large number of cathode-layer fingers, (ii) a gate layer contiguous with the fingers, with a PN junction J1 between each finger and the gate layer, (iii) a cathode electrode on each finger, and (iv) a gate electrode on the gate layer having portions surrounding the fingers disposed in spaced relation to the fingers. Turn-off of the GTO thyristor is effected by forcing a turn-off current to flow between the cathode electrode of each finger and the gate electrode through the associated PN junction J1. This PN junction at each finger has a centrally-located region that is characterized by an avalanche voltage that is substantially lower than the avalanche voltage that characterizes this junction in the region of the junction surrounding the centrally-located region, and this relatively lower avalanche voltage enhances the current turn-off capabilities of the GTO thyristor.

27 Claims, 3 Drawing Sheets

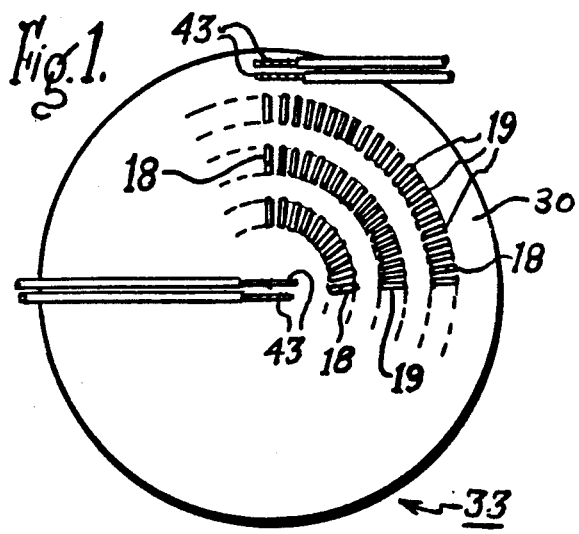
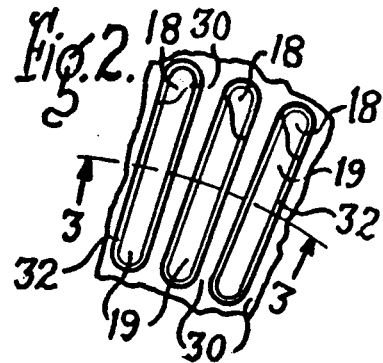
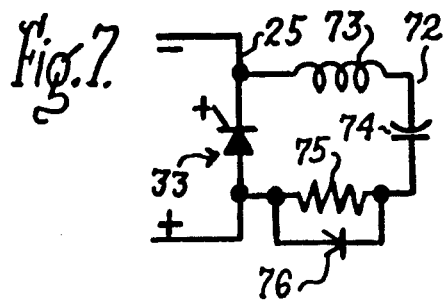
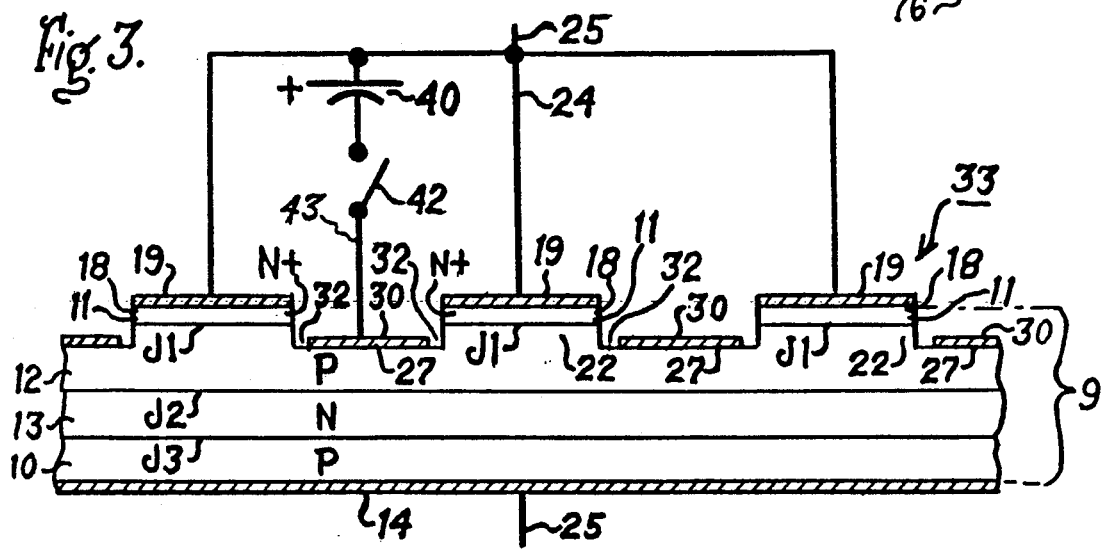
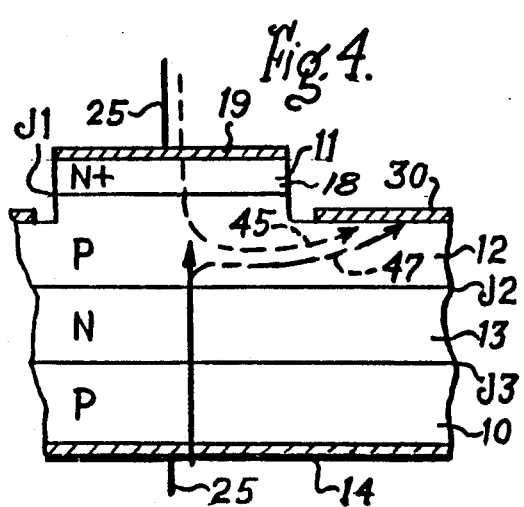
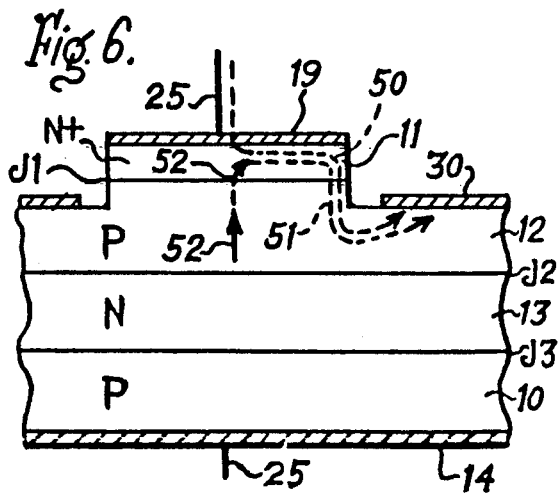

HIGH CURRENT GATE TURN-OFF THYRISTOR

This invention relates to four-layer, latching, semiconductor power devices, or thyristors, and, more particularly, to thyristors which can be turned off by application of a gate signal. Such thyristors are commonly referred to as GTO (or gate turn-off) thyristors. This invention is especially, though not exclusively, concerned with GTO thyristors of high current rating, e.g., rated at 1000 amperes or more.

BACKGROUND

The type of GTO thyristor that this invention is concerned with comprises a semiconductor body having at least four layers, with contiguous layers being of different P and N conductivity types and with one end layer constituting an anode layer, the opposed end layer constituting a cathode layer (or emitter), and an intermediate layer contiguous with the cathode layer constituting a gate layer, which has a gate electrode in ohmic contact therewith. When the thyristor is in its "on" state, power current enters the anode layer through an anode electrode thereon and flows through the semiconductor body between the anode and cathode layers, exiting through a cathode electrode.

Turn-off of this GTO thyristor is effected by forcing a turn-off current between the cathode electrode and the gate electrode via a path that extends first through the PN junction between the cathode layer and the gate layer (referred to hereinafter as junction J1) and then laterally of the gate layer into the gate electrode. This turn-off current flows through junction J1 in a direction opposite to the power current flowing therethrough.

To enable high values of anode-to-cathode current to be turned off by the GTO thyristor in response to a gate turn-off signal of the above character, the cathode layer of the thyristor is divided into many elongated fingers that share the anode-to-cathode current through the thyristor. In ohmic contact with each of these cathode-layer (or emitter) fingers is a registering portion of the cathode electrode. The gate layer has predetermined surface regions immediately adjacent the cathode-layer fingers that are not covered by these fingers and extend alongside the junction J1 between the associated cathode-layer finger and the gate layer. The gate electrode is in ohmic contact with these predetermined surface regions of the gate layer and has portions that extend alongside the cathode-layer fingers, but in spaced relationship to the associated fingers and cathode electrode portions thereon.

The above-described turn-off current is shared by all the cathode layer fingers, flowing through the associated PN junction J1 adjacent each finger, then laterally of the contiguous gate layer into the associated gate electrode. Each cathode-layer finger acts as the cathode layer of a miniature GTO thyristor, the miniature GTO thyristors all being connected in parallel and sharing the anode-to-cathode current through the overall thyristor. In a successful turn-off operation, the turn-off current, shared by all the miniature thyristors, forces to zero (or squeezes off) the anode-to-cathode current through all of them, though not precisely at the same instant. During the brief interval immediately after such current squeeze-off, all of the miniature thyristors, including the last one to have conducted, must withstand the voltage imposed across the J1 junction of the device without such a resumption of current thereacross that would again trigger any of the miniature thyristors into conduction. Such a retriggering would cause large values of anode-to-cathode current to flow through the retriggered miniature thyristor, and this would cause a failure of the overall thyristor.

OBJECTS

An object of this invention is to improve the cathode finger regions of a GTO thyristor in such a manner that the GTO thyristor can turn off higher currents than can corresponding prior GTO thyristors that do not include such improvement.

Another object is to construct each of the miniature GTO thyristors of the overall thyristor in such a way that the junction between its cathode layer finger and the gate layer has a reduced susceptibility to avalanching in a mode that can retrigger the miniature thyristor into conduction immediately following squeeze-off of current through the miniature thyristor by a gate signal.

SUMMARY

In carrying out the invention in one form, there is provided a GTO thyristor comprising a cathode, or emitter, layer of N type conductivity semiconductor material that is divided into a large number of elongated cathode-layer fingers, a gate layer of P type conductivity semiconductor material contiguous with said cathode layer fingers with a PN junction (J1) between each of said fingers and said gate layer, a cathode electrode on each finger in ohmic contact therewith, and a gate electrode in ohmic contact with the gate layer and having portions surrounding the fingers disposed in spaced relationship to said fingers. Turn-off of the GTO thyristor is effected by forcing a turn-off current to flow between the cathode electrode of each finger and said gate electrode through the PN junction (J1) between each finger and said gate layer. This PN junction (J1) between each cathode-layer finger and said gate layer has a centrally-located region that is characterized by an avalanche voltage that is substantially lower (i.e., at least 4 volts lower) than the avalanche voltage that characterizes this junction in the region of the junction surrounding the centrally-located region.

In one embodiment of the invention, the centrally-located region of each PN junction J1 has an electron injection efficiency that is made substantially lower than the electron injection efficiency that characterizes the region of PN junction J1 that surrounds the centrally-located region.

In another embodiment, the region of PN junction J1 that is at its outer periphery is located much closer to the middle junction (J2) of the thyristor than is the central region of PN junction J1, thus further increasing the electron injection efficiency at said outer periphery compared to that characterizing the central region of junction J1.

In one embodiment, electron injection efficiency in the central region of each PN junction J1 is decreased in comparison to that in surrounding regions of the junction by reducing the lifetime of conduction carriers in the gate-layer zone immediately adjacent said central region of the PN junction J1.

BRIEF DESCRIPTION OF DRAWINGS

For a better understanding of the invention, reference may be had to the following description taken in conjunction with the accompanying drawings, wherein:

FIG. 1 is a plan view of the multi-layer wafer of a GTO thyristor embodying one form of our invention, as viewed from the cathode side of the wafer.

FIG. 2 is an enlarged view of a portion of the GTO thyristor of FIG. 1 showing several side-by-side cathode-layer (or emitter) fingers.

FIG. 3 is an enlarged sectional view taken along the line 3—3 of FIG. 2.

FIG. 4 depicts in enlarged form a portion of the sectional view of FIG. 3 and contains arrows representing certain current relationships that are present therein at the start of a turn-off operation.

FIG. 5 includes an (a) portion and a (b) portion, both using the same time scale as an abscissa, the (a) portion depicting anode voltages and currents, and the (b) portion depicting gate voltages and current.

FIG. 6 is a sectional view similar to FIG. 4 but depicting certain current relationships that would be present if junction J1 avalanched near its outer perimeter, a condition that our invention avoids.

FIG. 7 is a schematic circuit diagram of a GTO thyristor connected in a power circuit and having a conventional snubber circuit connected in parallel therewith.

DETAILED DESCRIPTION OF EMBODIMENTS

Figure 5:
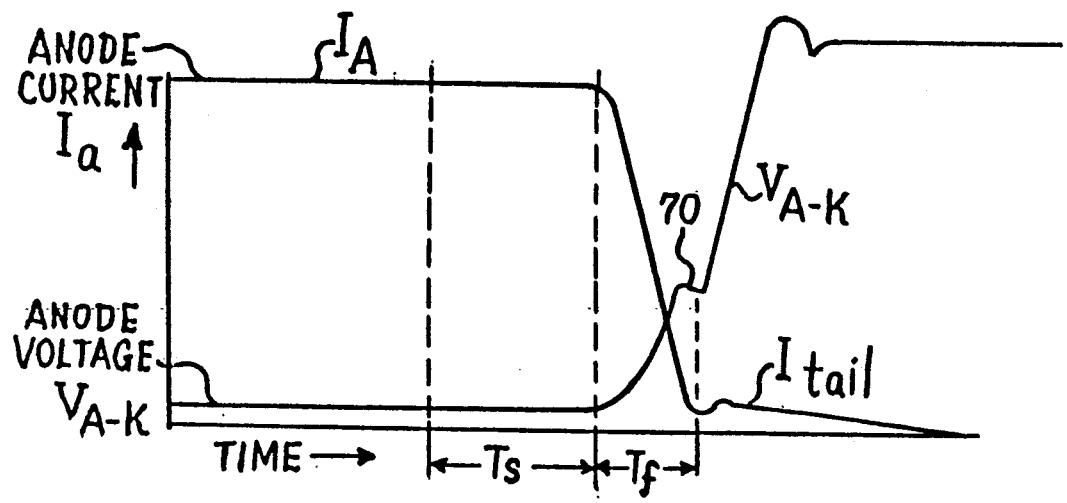
FIG. 5 is a graphic representation of certain current and voltage relationships present in the GTO thyristor during the turn-off operation.
Figure 5:
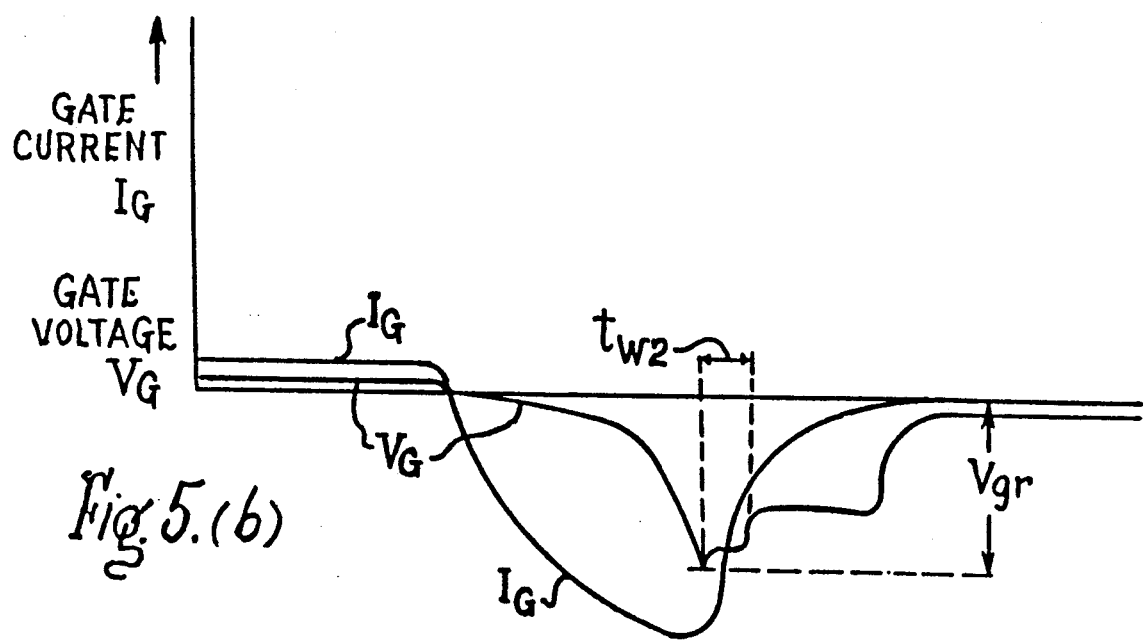

Referring now to FIGS. 1-3, the multi-layer thyristor wafer illustrated is a thin circular disc 9 of silicon comprising four layer, or lamellar zones, of alternately opposite P and N conductivity types forming three PN junctions therebetween. These four layers comprise end, or outer, anode and cathode layers 10 and 11 of P and N type silicon, respectively, and intermediate base layers 12 and 13 of P and N type silicon, respectively, thereby forming three PN junctions J1, J2 and J3 in series between opposite faces of the wafer. The cathode, or emitter, layer 11 is highly doped with a donor impurity, for example, to a concentration of about $10^{21}$ atoms per cubic centimeter, and is indicated in FIG. 3 as of N+ material. The base layer 12 contiguous to cathode layer 11 is doped with acceptor impurities, is lightly doped (except for a more heavily doped central zone 81 soon to be described in more detail), and is indicated in FIG. 3 as of P type material. The PN junction J1 is located between the base layer 12 and the cathode, or emitter, layer 11. Base layer 12 is also referred to herein as a gate layer.

On the outer surface of the P type anode layer 10 there is formed, as by alloying, a thin layer 14 of aluminum constituting an anode electrode that is in ohmic contact with the anode layer. At the opposite face of the wafer, the N+ type cathode layer 11 is divided into a large number of narrow elongated fingers 18. In the illustrated form of the invention, these fingers 18 extend radially of the circular silicon disc and are arranged in a plurality of ring-shaped arrays concentrically disposed about the center of the disc, as best shown in FIG. 1. On the outer surface of each of these fingers 18 and in ohmic contact therewith is a thin layer of aluminum 19 registering with the fingers. These thin layers of aluminum collectively constitute the cathode electrode of the overall thyristor. As shown in FIG. 3, disposed beneath each of the layers 18 of N+ materials is a projection, or mesa, 22 formed from the P type base layer 12 and extending upwardly from the remainder of this base layer 12.

In one form of the invention, a conductive clamping plate (not shown) is applied to the top of the overall thyristor to make contact with all of the cathodes 19 and, thus, to form a terminal for the thyristor connecting all of the cathodes 19 in parallel in the external power circuit in which the thyristor is connected. This parallel connection is schematically depicted at 24 in FIG. 3. The anode electrode 14 is suitably bonded to a circular plate (not shown) of tungsten or molybdenum or the like to form a terminal for connecting the anode in the external circuit indicated at 25. This anode connecting structure can be the usual tungsten or molybdenum plate structure that is used for the anode connection in conventional high current thyristors.

Referring to FIG. 3, in the illustrated thyristor, the base layer 12 that is contiguous with the cathode layer 11 serves as a gate layer. This gate layer 12 has a surface region 27 adjacent the cathode layer 11 that is not covered by the cathode layer. Covering this surface region 27 and in ohmic contact therewith is a thin metallic coating 30 that extends over the entire upper face of the silicon disc 9 except for the regions occupied by the mesas 22 and a narrow marginal region 32 surrounding the base of each of these mesas. The metallic coating 30 acts as a gate electrode for the thyristor, as will soon be explained.

Each of the cathode-layer fingers 18 acts as the cathode layer of a miniature GTO thyristor (depicted in FIG. 4) comprising the finger 18 as the top N layer and the portions of layers 12, 13 and 10 therebeneath as P, N, P layers, respectively. These miniature GTO thyristors are all effectively connected in parallel and together constitute the overall GTO thyristor, designated 33.

When the anode 14 of the overall thyristor is positive with respect to the cathode 19, no appreciable current flows between the anode and cathode unless a gating signal is applied between the gate 30 and the cathode 19. But when an appropriate gating signal that produces a predetermined minimum current flowing from gate to cathode via junction J1 in each miniature thyristor is applied, each miniature thyristor switches "on" and current flows between its anode and cathode. The triggering circuit for producing this gate-to-cathode current is conventional and is not shown in the drawings.

Turn-off of each of the miniature thyristors is effected in the illustrated GTO thyristor by supplying to the gate-to-cathode circuit of each a current of reverse polarity to the current that is used for turning on the miniature thyristor. In the illustrated embodiment, this current is derived from a source in the form of a charged capacitor 40 connected between the gate 30 and the cathode 19. A normally-open switch 42 in series with capacitor 40 in the external portion of the gate-cathode circuit normally prevents the capacitor from discharging, but when the switch is closed, the capacitor rapidly discharges through the gate-cathode circuit of each miniature thyristor and effects turn-off of the miniature thyristor, the collective effect of which is to turn off the overall thyristor.

Referring to FIG. 1, the above-described turn-off current is conducted from the gate 30 through conductive leads 43, some of which are shown in FIG. 1. There is a set of these leads at the center of the gate 30 and many sets (only one of which is shown) located at angularly-spaced points near the outer periphery of the gate.

Referring to the enlarged view of FIG. 4 and the graph of FIG. 5, the above-described turn-off of each miniature thyristor is effected in the following manner. Capacitor discharge current follows the dotted line path 45 of FIG. 4, flowing across the then-conducting junction J1, and then laterally of the P type gate layer 12, to the gate electrode 30 thereon. A protion of the main current, i.e., the anode-to-cathode current, also flows laterally across the P type gate layer 12 into the gate electrode 30, as indicated by the dot-dash arrows 47. The current flowing laterally of P type gate layer 12 (i) tends to clean out the middle junction J2 of carriers and thus to restore this junction J2 to its normal blocking condition and (ii) creates a voltage drop in a lateral direction along the junction J1 that results in the junction becoming progressively less positively biased proceeding from the center of the junction toward the gate contact 30. Eventually, the part of junction J1 that is closest to the gate contact 30 becomes reverse biased. As a result, all the forward current will be squeezed through the remaining part of junction J1 that is still forward biased, resulting in an increase in the local emitter current density. The forward current is progressively squeezed into a smaller and smaller emitting region near the center of junction J1 until some limiting region is reached. At this point, the excess charge that had remained in P type layer at the start of the turn-off process has been removed and the storage phase of the turn-off process has been completed. This storage phase is depicted in FIG. 5 during the interval $T_S$.

At this point, i.e., the end of the storage phase, the bias over the entire middle junction J2 has changed from forward to reverse. This is followed by a time interval known as the fall time (shown at $T_f$ in FIG. 5), during which the forward current is reduced almost to zero, and full blocking voltage is established across middle junction J2. Simultaneously, as shown in FIG. 5 by the sharp rise in $V_{A-K}$ during the period $T_f$, the anode-to-cathode voltage is rapidly increasing.

While the middle junction J2 is recovering its blocking abilities with respect to forward current during the fall period $T_f$, the junction J1 is recovering its blocking properties with respect to the turn-off, or capacitor discharge current ($I_G$, FIG. 5) flowing therethrough via dotted line path 45 of FIG. 4. Such recovery of blocking ability by junction J1 is able to proceed as a result of the above-described current squeeze-off action completed at the end of the storage period. As the blocking ability of junction J1 is recovered, the gate voltage across junction J1 builds up as depicted by the rise in voltage $V_G$ during period $T_f$ in FIG. 5.

If the voltage $V_G$ rises to the avalanche value of the junction J1, it will cause this junction to avalanche and admit current therethrough. The graph of FIG. 5 shows the voltage $V_G$ rising during period $T_f$ to the avalanche value $V_{gr}$ of the junction J1 and forcing the junction J1 to avalanche and thereafter admit current $I_G$ therethrough during the interval $t_{w2}$.

Our invention is concerned with controlling this avalanching process in such a way that the current admitted through junction J1 upon its avalanche does not establish conditions that retrigger the miniature thyristor into its "on" state of high anode-to-cathode current. We are able to attain this result by constructing the region of junction J1 in each miniature thyristor in such a manner that avalanching of any of the junctions J1 under these conditions occurs at its center rather than in its region(s) nearest to the associated gate electrode 30.

As a result of this avalanching in the center of junction J1 in preference to its outer regions, the turn-off current that flows upon avalanching does not flow laterally through N+ layer toward the gate electrode but rather follows the path 45 (shown in FIG. 4) through the center of junction J1 that it was following at the start of the storage period.

If the avalanching had instead occurred near the outer edge of junction J1 (i.e., the region nearest gate 30), the current path of the turn-off current through the N+ layer 11 would have been laterally of the N+ layer as depicted by dotted line arrow 50 in FIG. 6. There would also be flowing through such a lateral path 51 in the N+ layer a small component of current following the arrows 52 through the central region of the junction J1. This small component of current is due to high frequency voltage oscillations resulting from rapid redistributions of current through the miniature thyristors during the above-described squeeze-off of current therethrough. The small component of current that follows arrows 52 and the laterally extending path 51 through N+ layer 11 into the edge avalanche region can act as a turn-on current which retriggers the miniature thyristor into conduction. Such retriggering of the miniature thyristor would produce a failure of the overall thryristor because all the anode current would flow through the single miniature thyristor that had been retriggered, quickly overloading it and burning it out.

By forcing any avalanching of the junction J1 that occurs under these conditions to occur in the central region of junction J1, the high frequency current component that crosses junction J1 via the path represented by arrow 52 is rendered ineffective since its result is simply to reduce the value of turn-off current that is then flowing through this same central region in the opposite direction, i.e., as depicted by arrow 45 of FIG. 4. As a result, the high-frequency component of current is rendered ineffective to retrigger the miniature thyristor into conduction, thus allowing the turn-off process to be successfully completed.

By greatly reducing the susceptibility of each miniature thyristor to retriggering under these conditions, we are able to turn off much higher currents than can a corresponding prior GTO thyristor that does not include the improvement of the present invention, i.e., a substantially lower avalanche voltage of junction J1 centrally of each cathode layer finger than at its outer edge region.

Another result of this improvement is that our thyristor can withstand a higher amplitude spike 70 (FIG. 5) in the voltage $V_{A-K}$ that builds up across the thyristor near the end of the fall period $T_f$. This spike is caused primarily by the inductance in the usual LCR snubber circuit that is connected across the GTO thyristor.

Referring to FIG. 7, this snubber circuit is shown at 72 connected across GTO thyristor 33 and comprising the series combination of a parasitic inductance 73, a capacitance 74, and a resistance 75 having a diode 76 connected thereacross. By increasing the value of the spike voltage 70 that the thyristor can withstand, we are able to allow the value of the inductance 73 to be higher. This is advantageous because it gives greater latitude in the layout and selection of snubber circuit components, leading to lower cost.

Figure 8:
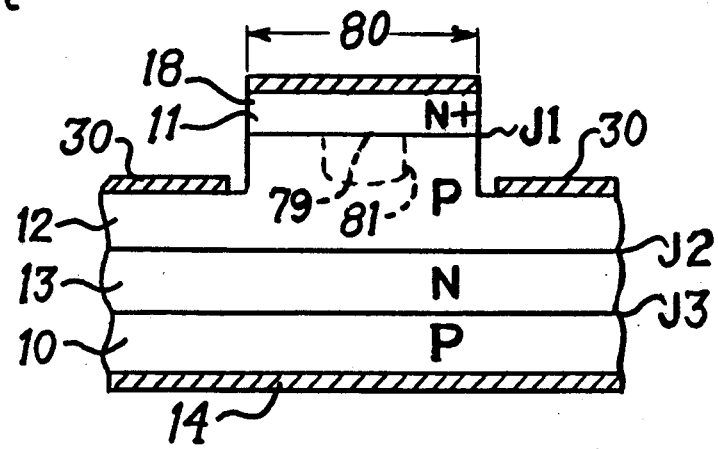
FIG. 8 is an enlarged sectional view of one of the miniature thyristors making up an overall GTO thyristor embodying one form of our invention.

In one form of the invention depicted in FIG. 8, the central region 79 of the junction J1 is made to have an avalanche voltage of about 15 to 20 volts and the remainder is made to have an avalanche voltage of about 25 to 35 volts. Our studies indicate that the center region's avalanche voltage should be at least 4 volts lower than that of the remaining junction region. In the embodiment of FIG. 8, the cathode layer fingers each have a width depicted at 80 of 6 mils and the low-avalanche voltage central region 79 of each junction 51 has a width of 2 mils.

Figure 9:
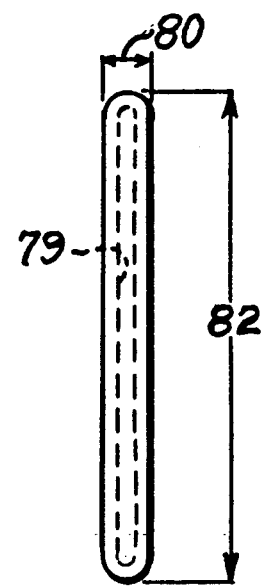
FIG. 9 is a plan view, on an enlarged scale, of a cathode-layer finger included in the embodiment of FIG. 8.

Referring to FIG. 9, the length 82 of each finger is about 100 mils, and the central region extends along most of this length but terminates about two mils from each end of the finger. Thus, there is a junction region of relatively higher avalanche voltage about 2 mils in width around the entire perimeter of the central region 79.

We achieve our desired reduction in avalanche voltage at the central region 79 of junction J1 by increasing the concentration of P type impurities in a localized zone 81 of the P layer 12 located immediately beneath the central region 79. There are many different ways of producing the desired high P concentration in this localized zone 81. One of these is to begin with a wafer that has its top portion (comprising what is shown in FIG. 8 as layers 12 and 11) substantially free of impurities, and then (as Step #1) to diffuse into this top portion from the top of the wafer a suitable P-type impurity. This diffusion step results in progressively increasing the P concentration in wafer portion 12, 11 as the distance from junction J2 increases and as the top surface of the wafer is approached. Then, as Step #2, to the top surface of the wafer, there is applied an oxide mask that covers all of this top surface except the regions beneath which the central parts of junction J1 will be located. Over these central regions, there are windows in the mask. Then through these windows additional P-type impurity is diffused from the top surface to a depth greater than the desired location of junction J1. Then, the mask is removed, and N-type impurity is diffused from the top surface of the wafer into the wafer, forming the N+ layer and the junction J1. The diffusion depth of the N-type impurity is less than that of the previously-added P-type material in the central region so that there remains in the central region at 81 a high concentration of P-type material beneath the junction J1.

Another way of producing the desired high P concentration beneath the center of junction J1 is to start out with the above-described Step #1 but then to use (instead of the first-described mask) oxide masks that cover only the regions where the windows of the first-described mask were located. Then N-type material is diffused from the top surface of the wafer into the unmasked upper regions of the wafer to form an N+ layer with the P regions of high concentration projecting therethrough. Then the entire upper portion of the wafer is diffused with N material to a depth less than the diffusion depth of the N material first applied. This results in a junction J1 of the cross-sectional configuration and character shown in FIG. 10.

The relatively high P concentration in the region 81 beneath the center of junction J1 has another effect that appears to be significant in the turn-off process. More specifically, this high P concentration lowers the electron injection efficiency of the junction J1 in the central region 79; and this lower injection efficiency at the center facilitates turn-off of the current squeezed toward the center as above described, the final stage of which occurs at the center of junction J1 at the end of the storage period of the turn-off operation.

Figure 10:
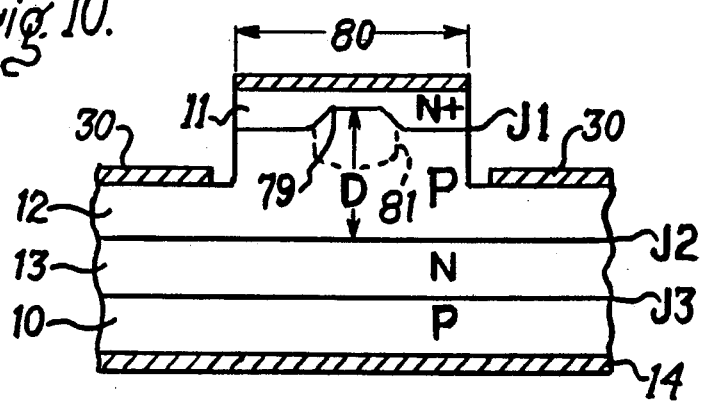
FIG. 10 is a sectional view showing a modified embodiment of the invention.

The embodiment of FIG. 10 is especially well suited to providing a low electron injection efficiency in the central region 79 of junction J1 because this central region is located a greater distance D from middle junction J2 than are the edge portions of junction J1. Generally speaking, the farther away any portion of junction J1 is from junction J2, the lower the electron injection efficiency of such portion.

Another way of decreasing the electron injection efficiency in the central region of junction J1 in order to enhance the turn-off capabilities of the thyristor is to reduce the lifetime of the conduction carriers in this central region. This is done by locally diffusing a lifetime-killing impurity such as platinum into the central region 81 of the P-type gate layer 12 or by suitably locally irradiating this region. Either of these techniques can be used alone or in combination with the techniques employed in the embodiments of FIGS. 8 and 10.

In the two embodiments of FIGS. 8 and 10, one undesirable effect of decreasing the electron injection efficiency of junction J1 in order to achieve higher turn-off capability is that this decreases the turn-on gain $\alpha$ of the top NPN transistor of the thyristor, i.e., the three-layer structure constituted by layers 11, 12 and 13. This results in an increase in the required turn-on gate current and also an increase in the forward-conduction voltage drop across the thyristor, both undesirable effects.

Figure 11:
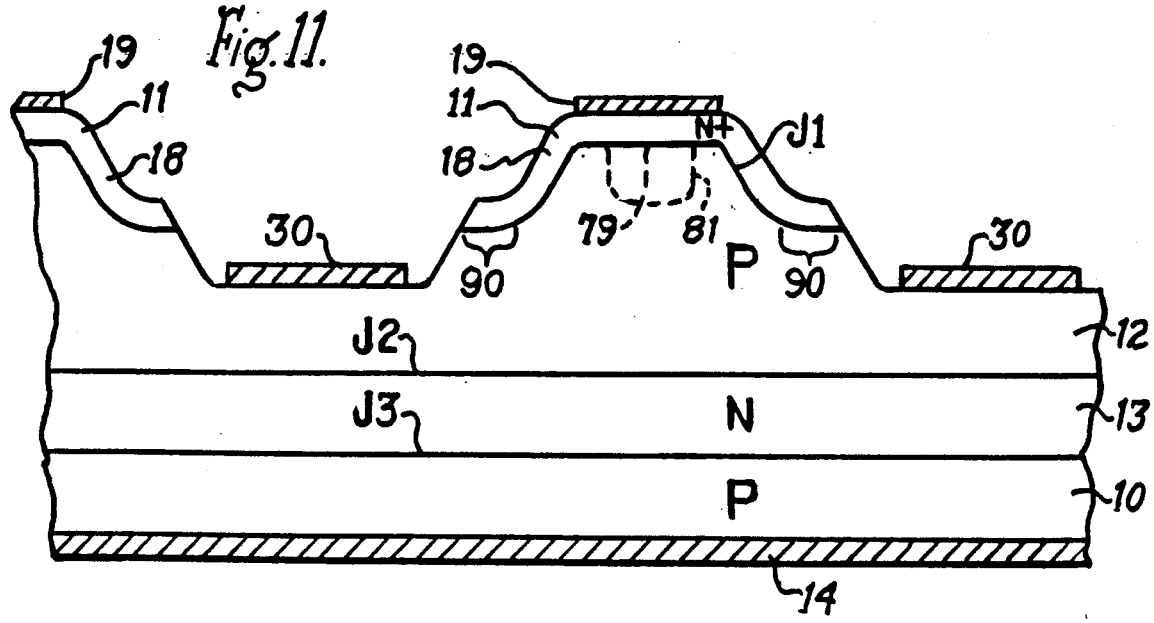
FIG. 11 is an enlarged sectional view showing another modified embodiment of the invention.

FIG. 11 illustrates a modified form of the invention that is able to reduce these increases in turn-on gate current and in forward-conduction voltage-drop, yet without affecting the improved turn-off ability. In this FIG. 11 embodiment, the cathode layer finger 18 is drastically lowered at its extreme outer region 90 adjacent its outer perimeter, thus bringing this region 90 closer to the middle junction J2 and also into a zone of gate layer 12 that has a much lower P concentration. This results in the junction J1 in outer region 90 having a higher injection efficiency, and this higher injection efficiency lowers the gate current required for effective turn-on of the thyristor. In addition, the region 90, because of its location in a zone of lower P concentration, is able to supply more injected electrons when the thyristor is "on", and this lowers the forward voltage drop produced by anode-to-cathode current.

Since this lowered region 90 is closest to the gate electrode 30, current in this region will be squeezed off first during a turn-off operation, as was explained hereinabove. As a result, the change in location of region 90 does not detract from the turn-off capability of the thyristor.

The embodiment of FIG. 11 otherwise corresponds to that of FIGS. 1-3 and 8, and identical reference characters are used to designate identical parts of the two embodiments. The FIG. 11 embodiment, like the other disclosed embodiments, can also have its turn-off capabilities enhanced by reducing the lifetime of the conduction carriers present in the central region 81 of each miniature thyristor as compared to the lifetime of the conduction carriers present in the gate layer regions adjacent junction J1 and surrounding central region 81.

While particular embodiments of the invention have been shown and described, it will be obvious to those skilled in the art that various changes and modifications may be made without departing from the invention in its broader aspects; and it is therefore intended herein to cover all such changes and modifications as fall within the true spirit and scope of the invention.

What is claimed as new is:

1. A gate turn-off thyristor comprising:
   (a) a multi-layer semiconductor body having at least four layers, with contiguous layers being of different P and N conductivity types and with at least three back-to-back PN junctions between contiguous layers; one end layer constituting an anode layer, an opposite end layer constituting a cathode layer, and an intermediate layer contiguous with said cathode layer constituting a gate layer; said gate layer having a predetermined surface region adjacent said cathode layer but uncovered by said cathode layer and extending alongside the PN junction between said cathode layer and said gate layer;
   (b) an anode electrode in ohmic contact with said anode layer,
   (c) an elongated cathode electrode in ohmic contact with said cathode layer, and
   (d) a gate electrode in ohmic contact with said gate layer in said predetermined surface region of said gate layer, said gate electrode extending alongside said elongated cathode electrode but spaced from said cathode electrode about the entire periphery of said cathode electrode, and in which:
   (e) the PN junction between said cathode layer and said gate layer has a region located centrally of said cathode electrode that is characterized by an avalanche voltage at least 4 volts lower than characterizes the region of said latter PN junction that is closest to said gate electrode.

2. A gate turn-off thyristor comprising:
   (a) a multi-layer semiconductor body having at least four layers, with contiguous layers being of different P and N conductivity types and with at least three back-to-back PN junctions between contiguous layers; one end layer constituting an anode layer, an opposite end layer constituting a cathode layer, and an intermediate layer contiguous with said cathode layer constituting a gate layer; said gate layer having a predetermined surface region adjacent said cathode layer but uncovered by said cathode layer and surrounding the PN junction between said cathode layer and said gate layer;
   (b) an anode electrode in ohmic contact with said anode layer,
   (c) an elongated cathode electrode in ohmic contact with said cathode layer, and
   (d) a gate electrode in ohmic contact with said gate layer in said predetermined surface region of said gate layer, said gate electrode surrounding said cathode electrode but spaced from said cathode electrode about the entire periphery of said cathode electrode, and in which:
   (e) the PN junction between said cathode layer and said gate layer has a region located centrally of said cathode electrode that is characterized by an avalanche voltage at least 4 volts lower than characterizes the region of said latter PN junction that surrounds said centrally-located junction region.

3. A gate turn-off thyristor as defined in claim 1 and further characterized by:
   (a) said cathode layer being divided into many elongated fingers, each finger cooperating with regions of the remaining layers near said finger to from a miniature gate turn-off thyristor, said miniature gate turn-off thyristors being effectively in parallel so as to share the current through said thyristor when the thyristor is "on",
   (b) said cathode electrode having portions respectively registering with said fingers and respectively forming cathode electrodes for said miniature gate turn-off thyristors,
   (c) said gate electrode having portions which respectively surround said fingers and are spaced from the outer perimeter of the junction J1 between the associated finger and the gate layer and are also spaced from the outer perimeter of the cathode electrode on the associated finger, and
   (d) the PN junction J1 between each cathode-layer finger and said gate layer having a region located centrally of said junction that is characterized by an avalanche voltage at least 4 volts lower than characterizes the region of said latter PN junction that is closet to said gate electrode.

4. A gate turn-off thyristor comprising:
   (a) a multi-layer semiconductor body having at least four layers, with contiguous layers being of different P and N conductivity types and with at least three back-to-back PN junctions between contiguous layers; one end layer constituting an anode layer, an opposite end layer constituting a cathode layer, and an intermediate layer contiguous with said cathode layer constituting a gate layer; said cathode layer being divided into many elongated fingers, each finger cooperating with regions of the remaining layers near said finger to form a miniature gate turn-off thyristor which is effectively in parallel with the other gate turn-off thyristors so formed; said gate layer having predetermined surface regions adjacent said cathode layer but uncovered by said cathode-layer fingers and respectively surrounding the PN junctions between said fingers and the gate layer;
   (b) an anode electrode in ohmic contact with said anode layer,
   (c) a cathode electrode having elongated portions respectively registering with and in ohmic contact with said fingers,
   (d) a gate electrode in ohmic contact with said gate layer in said predetermined surface regions of said gate layer, said gate electrode surrounding the PN junctions between said fingers and the gate layer, and in which:
   (e) the PN junction (J1) between each cathode-layer finger and said gate layer has a region located centrally of said junction that is characterized by an avalanche voltage at least 4 volts lower than characterizes the region of said latter PN junction that surrounds said centrally-located junction region.

5. A gate turn-off thyristor as defined in claim 4 in which said central region of said PN junction (J1) has a lower electron injection efficiency than characterizes the region of said PN junction (J1) that surrounds said centrally-located junction region.

6. The gate turn-off thyristor of claim 4 in which each of said miniature gate turn-off thyristors includes in the gate layer thereof immediately adjacent said central region of the PN junction (J1) a zone having a higher concentration of P-type impurities than is present in the zones of said gate layer immediately adjacent the regions of said latter PN junction that surround said centrally-located junction region.

7. The gate turn-off thyristor of claim 5 in which each of said miniature gate turn-off thyristors includes in the gate layer thereof immediately adjacent said central region of the PN junction (J1) a zone having a higher concentration of P-type impurities than is present in the zones of said gate layer immediately adjacent the regions of said latter PN junction that surround said centrally-located junction region.

8. The gate turn-off thyristor of claim 4 in which in each miniature gate turn-off thyristor most of said central region of said PN junction (J1) is located a greater distance from the middle PN junction (J2) than is the region of said PN junction (J1) that surrounds said central region.

9. The gate turn-off thyristor of claim 5 in which in each miniature gate turn-off thyristor most of said central region of said PN junction (J1) is located a greater distance from the middle PN junction (J2) than is the region of said PN junction (J1) that surrounds said central region.

10. The gate turn-off thyristor of claim 6 in which in each miniature gate turn-off thyristor most of said central region of said PN junction (J1) is located a greater distance from the middle PN junction (J2) than is the region of said PN junction J1 that surrounds said central region.

11. The gate turn-off thyristor of claim 4 in which in each of said miniature thyristors:
(a) the gate layer has a portion projecting from the surface of the gate layer in ohmic contact with said gate electrode,
(b) said cathode-layer finger is located at the outer end of said projecting portion, and
(c) the region of the PN junction (J1) immediately adjacent the outer perimeter of said junction (J1) is located much closer to said gate electrode than is the central region of said PN junction (J1).

12. The gate turn-off thyristor of claim 11 in which said junction region at the outer perimeter of said junction J1 has a substantially higher injection efficiency than said central and adjacent regions of the PN junction J1.

13. The gate turn-off thyristor of claim 11 in which said junction region at the outer perimeter of said junction J1 is located immediately adjacent a zone of said gate layer having a substantially lower concentration of P type impurities than is present in (i) the zone of said gate layer immediately adjacent said central region of the PN junction J1 and (ii) the zone of said gate layer immediately surrounding said central gatelayer zone.

14. In a GTO thyristor comprising an emitter layer of N type conductivity semiconductor material that is divided into a large number of elongated emitter fingers, a gate layer of P type conductivity semiconductor material contiguous with said emitter fingers with a PN junction between each of said emitter fingers and said gate layer, a cathode electrode on each emitter finger in ohmic contact with said finger, a gate electrode in ohmic contact with said gate layer and having portions surrounding said emitter fingers disposed in spaced relationship to said emitter fingers, and in which:
(a) turn-off of said GTO thyristor is effected by forcing a turn-off current to flow between the cathode electrode of each emitter finger and said gate electrode through the PN junction between each emitter finger and said gate layer, and
(b) the PN junction between each of said emitter fingers and said gate layer has in its central region an avalanche voltage that is lower by at least 4 volts than the avalanche voltage of said junction in the region near the outer perimeter of said junction, considered under conditions prevailing during turn-off of said GTO thyristor immediately following squeeze-off of the forward current through the PN junction at each emitter finger.

15. A gate turn-off thyristor comprising:
(a) a multi-layer semiconductor body having at least four layers, with contiguous layers being of different P and N conductivity types and with at least three back-to-back PN junctions between contiguous layers; one end layer constituting an anode layer, an opposite end layer constituting a cathode layer, and an intermediate layer contiguous with said cathode layer constituting a gate layer; said cathode layer being divided into many elongated fingers, each finger cooperating with regions of the remaining layers near said finger to form a miniature gate turn-off thyristor which is effectively in parallel with the other gate turn-off thyristors so formed; said gate layer having predetermined surface regions adjacent said cathode layer but uncovered by said cathode-layer fingers and respectively surrounding the PN junctions between said fingers and the gate layer;
(b) an anode electrode in ohmic contact with said anode layer,
(c) a cathode electrode having elongated portions respectively registering with and in ohmic contact with said fingers,
(d) a gate electrode in ohmic contact with said gate layer in said predetermined surface regions of said gate layer, said gate electrode surrounding the PN junctions between said fingers and the gate layer, and in which:
(e) the PN junction (J1) between each cathode-layer finger and said gate layer has a region located centrally of said junction that has a lower electron injection efficiency than characterizes the region of said latter PN junction that surrounds said centrally-located junction region, and in which:
(f) each of said miniature gate turn-off thyristors includes in the gate layer thereof immediately adjacent said central region of the PN junction (J1) a zone in which the conduction carriers present are characterized by having a lifetime substantially shorter than characterizes the conduction carriers present in the zones of said gate layer immediately adjacent the regions of said latter PN junction that surround said centrally-located junction region.

16. The gate turn-off thyristor of claim 15 in which each of said miniature gate turn-off thyristors includes in the gate layer thereof immediately adjacent said central region of the PN junction (J1) a zone having a higher concentration of P-type impurities than is present in the zones of said gate layer immediately adjacent the regions of said latter PN junction that surround said centrally-located junction region.

17. A gate turn-off thyristor comprising:

(a) a multi-layer semiconductor body having at least four layers, with contiguous layers being of different P and N conductivity types and with at least three back-to-back PN junctions between contiguous layers; one end layer constituting an anode layer, an opposite end layer constituting a cathode layer, and an intermediate layer contiguous with said cathode layer constituting a gate layer; said cathode layer being divided into many elongated fingers, each finger cooperating with regions of the remaining layers near said finger to form a miniature gate turn-off thyristor which is effectively in parallel with the other gate turn-off thyristors so formed; said gate layer having predetermined surface regions adjacent said cathode layer but uncovered by said cathode-layer fingers and respectively surrounding the PN junctions between said fingers and the gate layer;

(b) an anode electrode in ohmic contact with said anode layer.

(c) a cathode electrode having elongated portions respectively registering with and in ohmic contact with said fingers;

(d) a gate electrode in ohmic contact with said gate layer in said predetermined surface regions of said gate layer, said gate electrode surrounding the PN junctions between said fingers and the gate layer, and in which:

(e) the PN junction (J1) between each cathode layer finger and said gate layer has a region located centrally of said junction that has a lower electron injection efficiency than characterizes the region of said latter PN junction that surrounds said centrally-located junction region and (f) in each miniature gate turn-off thyristor most of said central region of said PN junction (J1) is located a greater distance from the middle PN junction (J2) than is the region of said PN junction (J1) surrounds said central region.

18. A gate turn-off thyristor comprising:

(a) a multi-layer semiconductor body having at least four layers, with contiguous layers being of different P and N conductivity types and with at least three back-to-back PN junctions between contiguous layers; one end layer constituting an anode layer, an opposite end layer constituting an anode layer, and an intermediate layer contiguous with said cathode layer constituting a gate layer; said cathode layer being divied into many elongated fingers, each finger cooperating with regions of the remaining layers near said finger to form a miniature gate turn-off thyristor which is effectively in parallel with the other gate turn-off thyristors so formed; said gate layer having predetermined surface regions adjacent said cathode layer but uncovered by said cathode-layer fingers and respectively surrounding the PN junctions between said fingers and the gate layer;

(b) an anode electrode in ohmic contact with said anode layer, (c) a cathode electrode having elongated portions respectively registering with and in ohmic contact with said fingers, (d) a gate electrode in ohmic contact with said gate layer in predetermined surface regions of said gate layer, said gate electrode surrounding the PN junctions between said fingers and the gate layer, and in which:

(e) the PN junction (J1) between each cathode-layer finger and said gate layer has a region located centrally of said junction that has a lower electron injection efficiency than characterizes the region of said latter PN junction that surrounds said centrally-located junction region, and in each of said miniature thyristors:

(f) the gate layer has a portion projecting from the surface of the gate layer in ohmic contact with said gate electrode, (g) said cathode-layer finger is located at the outer end of said projecting portion, and (h) the region of the PN junction (J1) immediatley adjacent the outer perimeter of said junction (J1) is located much closer to said gate electrode and also much closer to said middle PN junction (J2) than is the central region of said PN junction (J1).

19. The gate turn-off thyristor of claim 18 in which said junction region at the outer perimeter of said junction J1 has a substantially higher injection efficiency than said central and adjacent regions of the PN junction J1.

20. The gate turn-off thyristor of claim 18 in which said junction region at the outer perimeter of said junction J1 is located immediately adjacent a zone of said gate layer having a substantially lower concentration of P-type impurities than is present in (i) the zone of said gate layer immediately adjacent said central region of the PN junction J1 and (ii) the zone of said gate layer immediately surrounding said central gatelayer zone.

21. The gate turn-off thyristor of claim 17 in which each of said miniature gate turn-off thyristors includes in the gate layer thereof immediately adjacent said central region of the PN junction (J1) a zone in which the conduction carriers present are characterized by having a lifetime substantially shorter than characterizes the conduction carriers present in the zones of said gate layer immediately adjacent the regions of said latter PN junction that surround said centrally-located junction region.

22. The gate turn-off thyristor of claim 18 in which each of said miniature gate turn-off thyristors includes in the gate layer thereof immediately adjacent said central region of the PN junction (J1) a zone in which the conduction carriers present are characterized by having a lifetime substantially shorter than characterizes the conduction carriers present in the zones of said gate layer immediately adjacent the regions of said latter PN junction that surround said centrally-located junction region.

23. The gate turn-off thyristor of claim 19 in which each of said miniature gate turn-off thyristors includes in the gate layer thereof immediately adjacent said central region of the PN junction (J1) a zone in which the conduction carriers present are characterized by having a lifetime substantially shorter than characterizes the conduction carriers present in the zones of said gate layer immediately adjacent the regions of said latter PN junction that surround said centrally-located junction region.

24. The gate turn-off thyristor of claim 20 in which each of said miniature gate turn-off thyristors includes in the gate layer thereof immediately adjacent said central region of the PN junction (J1) a zone in which the conduction carriers present are characterized by having a lifetime substantially shorter than characterizes the conduction carriers present in the zones of said gate layer immediately adjacent the regions of said latter PN junction that surround said centrally-located junction region.

25. The gate turn-off thyristor of claim 14 in which each of said miniature gate turn-off thyristors includes in the gate layer thereof immediately adjacent said central region of the PN junction (J1) a zone in which the conduction carriers present are characterized by having a lifetime substantially shorter than characterizes the conduction carriers present in the zones of said gate layer immediately adjacent the regions of said latter PN junction that surround said centrally-located junction region.

26. The gate turn-off thyristor of claim 4 in which in each of said miniature thryistors:

(a) the gate layer has a portion projecting from the surface of the gate layer in ohmic contact with said gate electrode,
(b) said cathode-layer finger is located at the outer end of said projecting portion, and
(c) the region of the PN junction (J1) immediately adjacent the outer perimeter of said junction (J1) is located much closer to said gate electrode and also much closer to the middle PN junction (J2) than is the central region of said PN junction (J1).

27. The gate turn-off thyristor of claim 10 in which the P-type impurities in said gate layer of each miniature gate turn-off thyristor increase in concentration as the distance from the middle junction (J2) increases, thus causing the gate layer immediately adjacent said central region of said PN junction (J1) located a greater distance from said middle junction (J2) to have a relatively high P-type impurity concentration compared to that of the gate layer immediately adjacent said surrounding region of said PN junction (J1).

* * * * *